(12) United States Patent
Kim

(10) Patent No.: US 11,694,915 B2
(45) Date of Patent: Jul. 4, 2023

(54) TRANSFERRING DEVICE OF SEMICONDUCTOR MANUFACTURING AND METHOD OF CLEANING TRANSFERRING CHAMBER OF THE TRANSFERRING DEVICE

(71) Applicant: XIA TAI XIN SEMICONDUCTOR (QING DAO) LTD., Qingdao (CN)

(72) Inventor: Dea-Jin Kim, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 648 days.

(21) Appl. No.: 16/661,139

(22) Filed: Oct. 23, 2019

(65) Prior Publication Data
US 2020/0203198 A1 Jun. 25, 2020

Related U.S. Application Data

(60) Provisional application No. 62/781,620, filed on Dec. 19, 2018.

(51) Int. Cl.
*B08B 9/00* (2006.01)
*H01L 21/67* (2006.01)
(Continued)

(52) U.S. Cl.
CPC ......... *H01L 21/67196* (2013.01); *B08B 5/04* (2013.01); *B08B 9/00* (2013.01);
(Continued)

(58) Field of Classification Search
CPC ......... H01L 21/67196; H01L 21/67017; H01L 21/67167; H01L 21/67248;
(Continued)

(56) References Cited

U.S. PATENT DOCUMENTS

| | | | |
|---|---|---|---|
| 2004/0134612 A1* | 7/2004 | Numata | H01J 37/32522 156/345.33 |
| 2004/0187452 A1* | 9/2004 | Edo | B01D 53/265 55/385.2 |

(Continued)

FOREIGN PATENT DOCUMENTS

| | | |
|---|---|---|
| CN | 102347207 A | 2/2012 |
| CN | 206838662 U | 1/2018 |
| TW | I284350 | 7/2007 |

*Primary Examiner* — Erin F Bergner
(74) *Attorney, Agent, or Firm* — ScienBiziP, P.C.

(57) ABSTRACT

A device for maintaining cleanliness in a vacuum environment during semiconductor manufacture in a device storing and transferring wafers into etching and other manufacturing processes includes a transferring chamber storing wafers, a vacuum system to extract particles from the transferring chamber, and a thermoelectric device for temperature control. The vacuum system includes an extracting pipe, the thermoelectric device includes a cooling apparatus to cool the transferring chamber, and a monitoring device to detect particle concentrations in the transferring chamber. The cooling apparatus includes Peltier elements arranged on the extracting pipe to cool and thus cause the descent of fumes and particles towards a low-set extraction area.

13 Claims, 9 Drawing Sheets

(51) Int. Cl.
*B65G 47/90* (2006.01)
*H01L 21/677* (2006.01)
*B08B 13/00* (2006.01)
*B08B 5/04* (2006.01)

(52) U.S. Cl.
CPC .............. *B08B 13/00* (2013.01); *B65G 47/90* (2013.01); *H01L 21/67017* (2013.01); *H01L 21/67167* (2013.01); *H01L 21/67248* (2013.01); *H01L 21/67253* (2013.01); *H01L 21/67742* (2013.01)

(58) Field of Classification Search
CPC ......... H01L 21/67253; H01L 21/67742; H01L 21/67109; B08B 5/04; B08B 9/00; B08B 13/00; B65G 47/90; B65G 45/10; B65G 43/08

See application file for complete search history.

(56) References Cited

U.S. PATENT DOCUMENTS

| | | |
|---|---|---|
| 2010/0043894 A1 | 2/2010 | Moriya et al. |
| 2018/0156727 A1* | 6/2018 | Zhang ..................... G01N 1/22 |

* cited by examiner

TRANSFERRING DEVICE OF SEMICONDUCTOR MANUFACTURING AND METHOD OF CLEANING TRANSFERRING CHAMBER OF THE TRANSFERRING DEVICE

FIELD

The present disclosure relates to semiconductor manufacture.

BACKGROUND

Certain stages of semiconductor manufacturing, such as plasma etcher and chemical vapor deposition, are carried out in low atmospheric or near vacuum conditions. The interior condition of semiconductor processing tools used in these manufacturing stages of the semiconductors must be kept in low pressure/vacuum condition. To achieve (near) vacuum condition, vacuum pumps are utilized. To maintain the vacuum condition in the processing tools, one or more load lock chambers and a transfer chamber are provided as an interface between a cluster of processing tools and one or more loading ports. Maintaining readiness and cleanliness in the above equipment may be problematic.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

A description of specific embodiments of the present application is with reference to the accompanying drawings. However, the present application can be implemented in many other ways different from those described herein, and those skilled in the art can make similar improvements without violating the contents of the present application. Therefore, the present application is not to be considered as limiting the scope of the embodiments described herein.

Unless otherwise defined, all technical and scientific terms used herein have the same meaning as commonly understood by one skilled in the art. The terms used in a specification of the present application herein are only for describing specific embodiments, and are not intended to limit the present application.

First Embodiment

Figure 1:
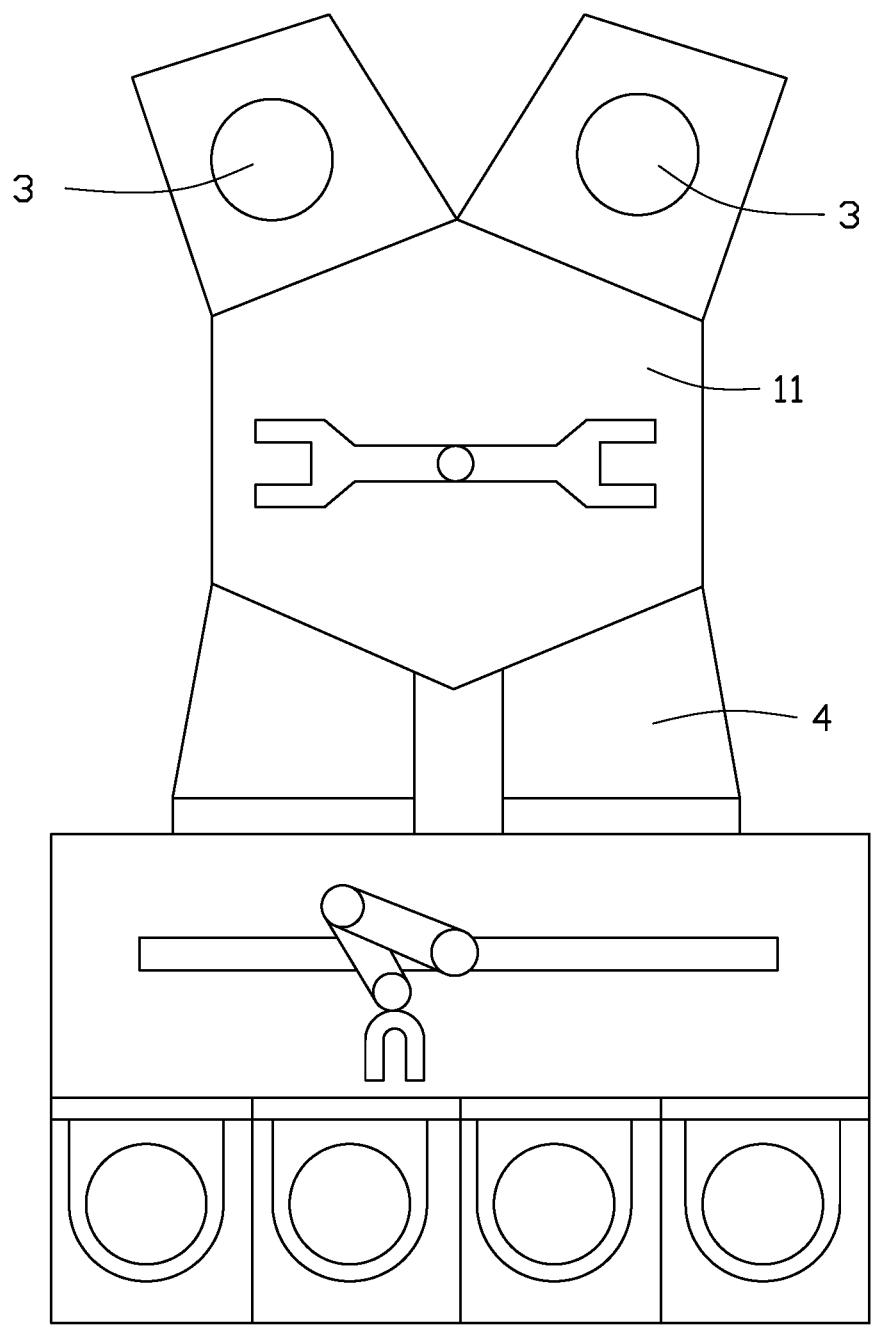
FIG. 1 illustrates a structure of a semiconductor processing equipment in an embodiment.
Figure 2:
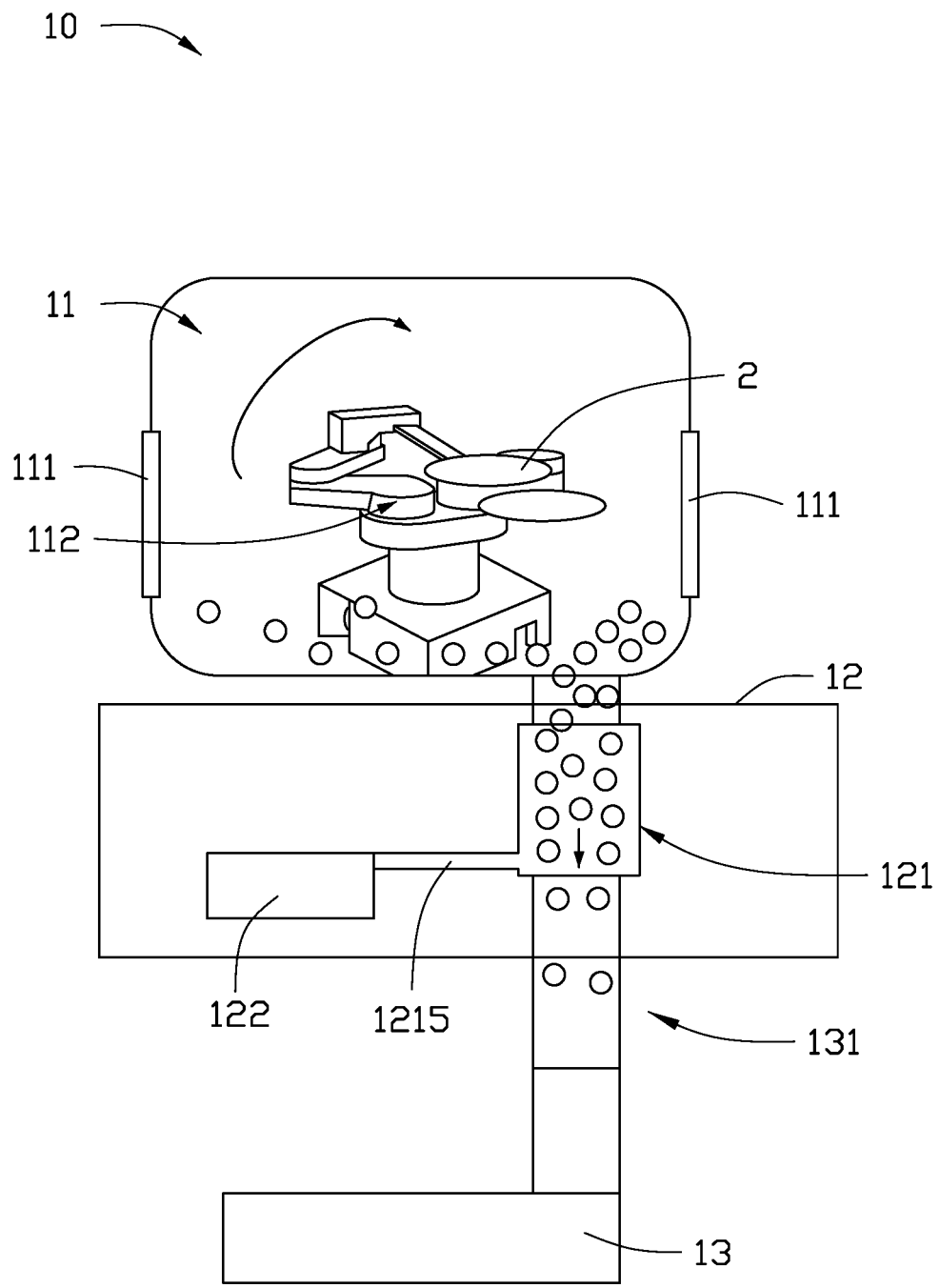
FIG. 2 illustrates a structure of a transferring device in the arrangement of FIG. 1.

Referring to FIG. 1 and FIG. 2, a transferring device 10 includes a transferring chamber 11, a thermoelectric device 12, and a vacuum system 13. The thermoelectric device 12 is positioned with the vacuum system 13. The vacuum system 13 communicates with the transferring chamber 11. The transferring device 10 may be included in a plasma etcher.

A wafer 2 to be etched is stored in the transferring chamber 11. A transferring mechanism 112 for supporting and moving the wafer 2 is arranged in the transferring chamber 11. In the first embodiment, the transferring mechanism 112 is a robot. At least two doors 111 are defined in the transferring chamber 11 at sides, one or more processing chambers 3 and load lock chambers 4 may communicate with the transferring chamber 11 when the doors 111 are open.

When one of the doors 111 located between the transferring chamber 11 and the load lock chamber 4 is open, the transferring mechanism 112 is able to pick up the wafer 2 in the load lock chamber 4 and move the wafer 2 into the transferring chamber 11. The door 111 between the transferring chamber 11 and the load lock chamber 4 is then closed. When a processing chamber 3 is available for an etching process, the other door 111 located between the transferring chamber 11 and the processing chamber 3 is open, and the transferring mechanism 112 moves the wafer 2 into the processing chamber 3. Then the other door 111 is closed, and the etching processing is executed. After etching process is finished, the other door 111 opens again, and the transferring mechanism 112 moves the wafer 2 back to the transferring chamber 11.

The vacuum system 13 is positioned under the transferring chamber 11, and extracts particles and fumes from the transferring chamber 11. The vacuum system 13 includes an extracting pipe 131 through which the vacuum system 13 sucks particles and fumes in the transferring chamber 11. The thermoelectric device 12 includes a cooling apparatus 121 and a monitoring device 122. The cooling apparatus 121 is positioned below the transferring chamber 11 to cool the transferring chamber 11, the particles and fumes with high temperatures in the transferring chamber 11 can be attracted by the cooling apparatus 121 with a low temperature. The particles and fumes can be cooled and kinetic energy of the particles and fumes is reduced. Therefore, the particles and fumes can fall to a lower part of the transferring chamber 11 due to the low temperature, and the vacuum system 13 is able to extract the particles and fumes at the lower part of the transferring chamber 11. The monitoring device 122 detects concentration of the particles in the transferring chamber 11. Thus, engineers can monitor the cleanness level of the transferring chamber 11 and decide when to clean the transferring chamber 11 based on the particle level in the transferring chamber 11. In an embodiment, if the concentration of the particles is greater than or equal to a predetermined threshold value, a cleaning alert is sent by the monitoring device 122. In another embodiment, the cleanness levels are ranked as 1-5 according to the detected concentration of the particles. If the cleanness level reaches level 5, the engineers have to clean the transferring chamber 11 as soon as possible.

Figure 3:
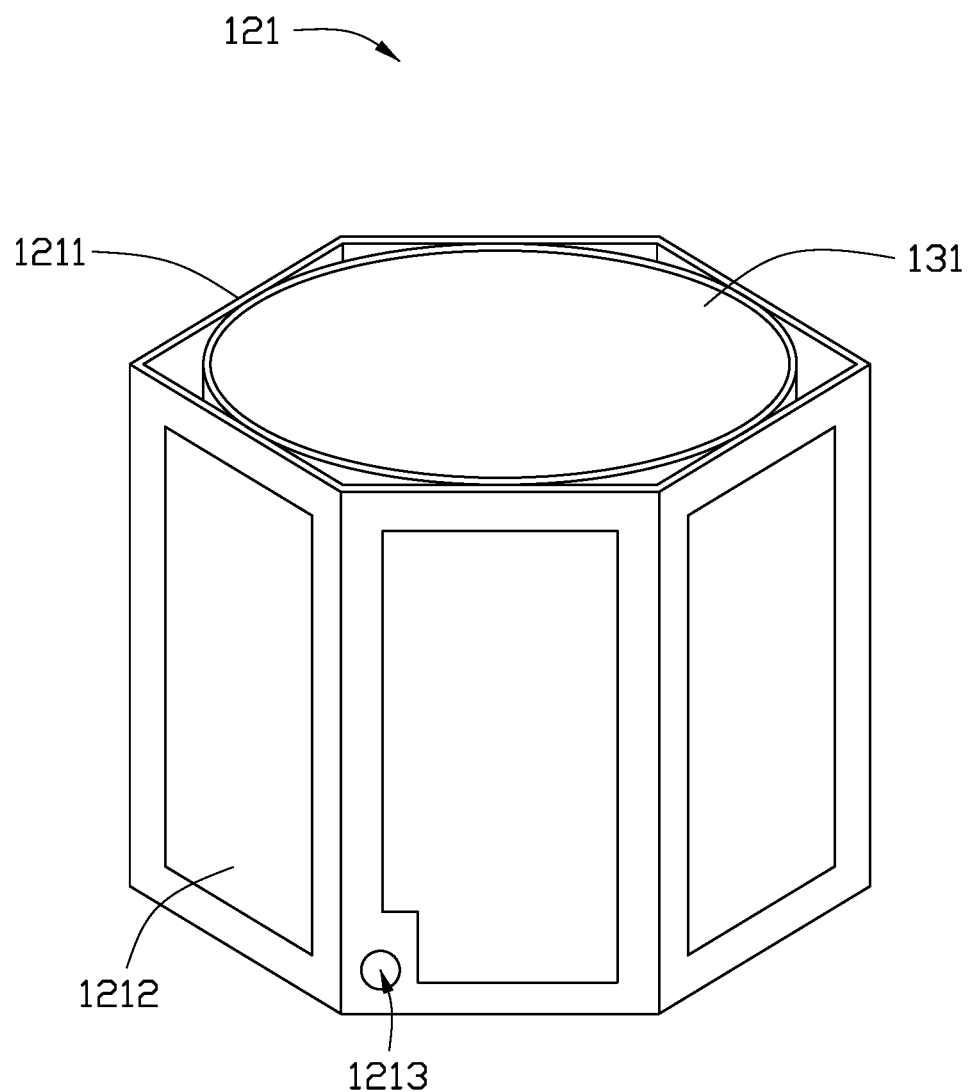
FIG. 3 illustrates a structure of a cooling apparatus of the transferring device of FIG. 2.

Referring to FIG. 2 and FIG. 3, the cooling apparatus 121 includes a polygonal shell 1211 and a plurality of Peltier elements 1212. The polygonal shell 1211 is arranged around the extracting pipe 131, and the plurality of Peltier elements 1212 are arranged on the polygonal shell 1211 to cool the transferring chamber 11. The monitoring device 122 is positioned at the bottom of the cooling apparatus and communicates with the extracting pipe 131.

Figure 4A:
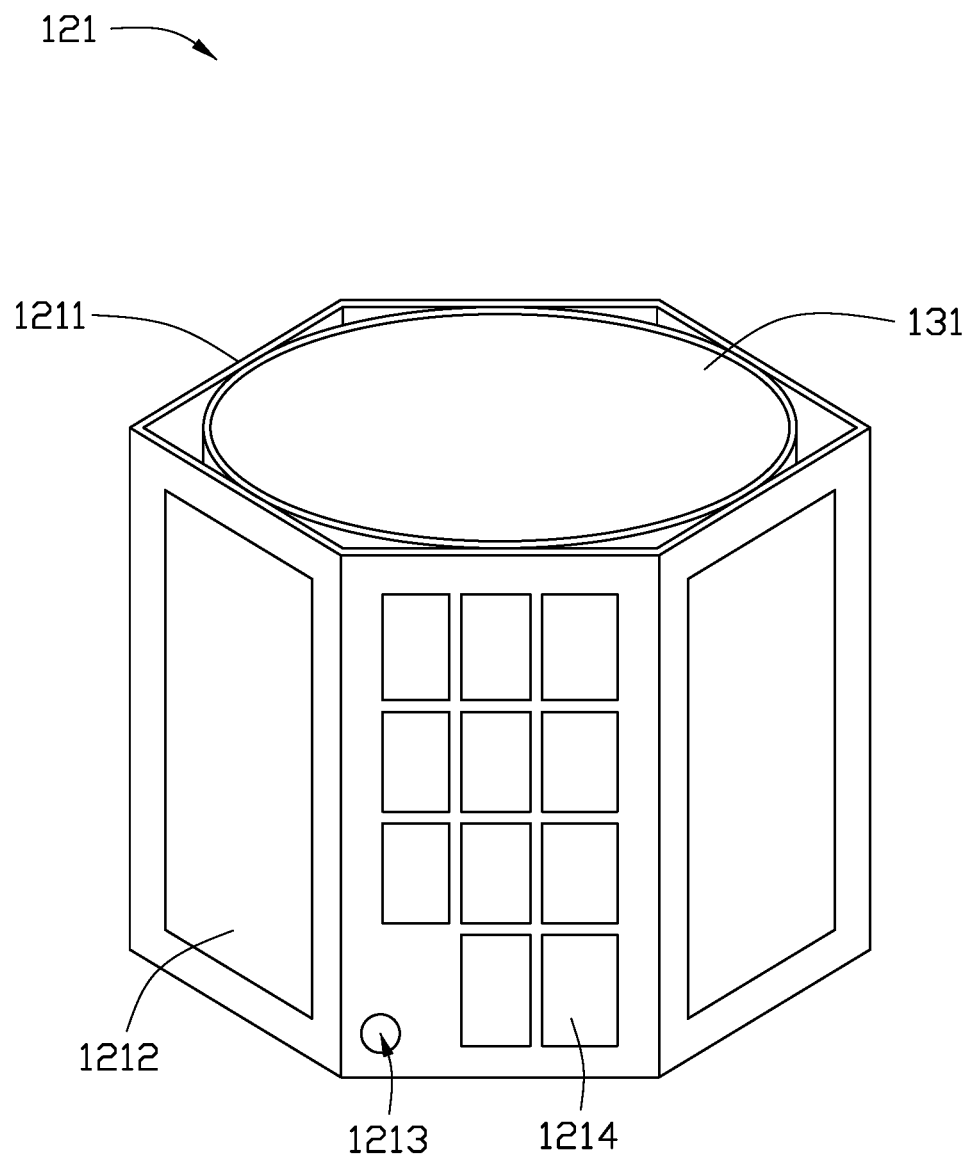
FIG. 4A and FIG. 4B illustrates structures of Peltier elements with different size.
Figure 4B:
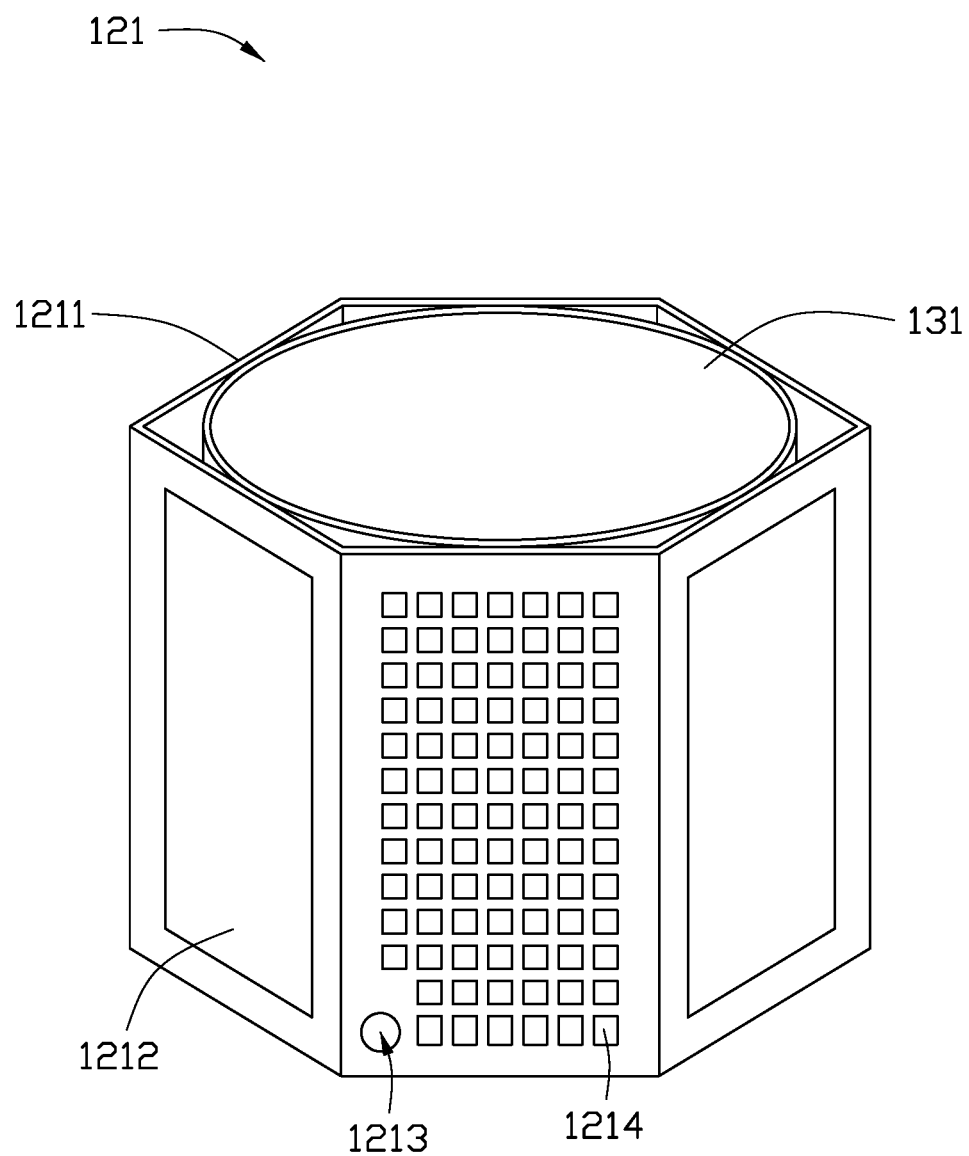
Figure 4C:
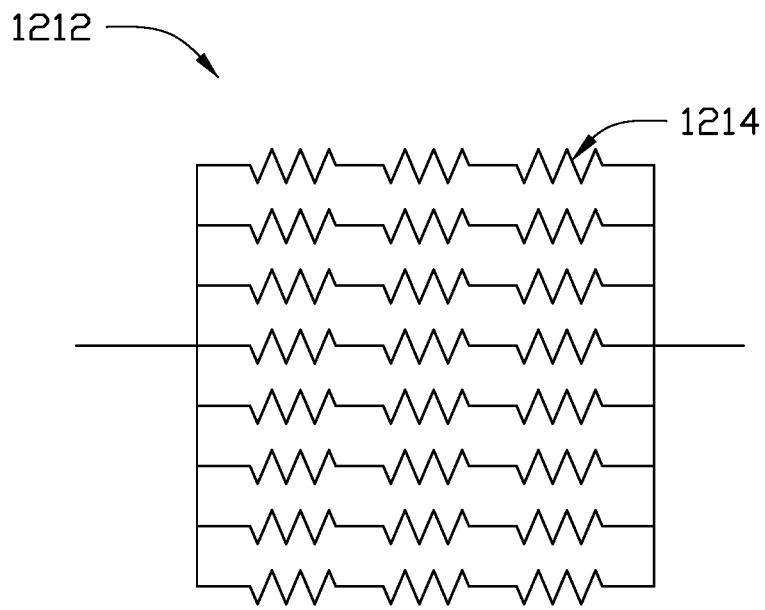
FIG. 4C and FIG. 4D illustrates circuits' diagram of Peltier elements.
Figure 4D:
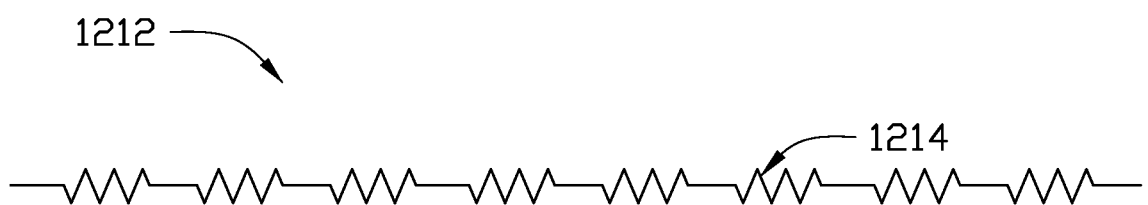

Referring to FIG. 3, FIG. 4C, and FIG. 4D, the plurality of Peltier elements 1212 is positioned on outer circumference of the polygonal shell 1211. The plurality of Peltier elements 1212 are laid in series or in parallel. One of the Peltier elements 1212 is electrically connected to a DC power source. The Peltier element 1212 operates based on the Peltier effect. The Peltier element 1212 has two sides, and when a DC electric current flows through the Peltier element 1212, heat is brought from one side to the other, so that one side gets cooler while the other gets hotter. Multiple Peltier elements 1212 can be cascaded together for enhancing cooling efficiency. The temperature in the polygonal shell 1211 equipped with the Peltier elements 1212 can reach −10° C. to −20° C. Since the cooling apparatus 121 is not isolated, the transferring chamber 11 is also cooled due to the low temperature of the polygonal shell 1211, and temperature at the bottom portion of the transferring chamber 11 is the lowest. Therefore, active particles and fumes that results from higher temperature during fabrication process or etching process, will be cooled, and the spread of particles is reduced to an area at the bottom region of the transferring chamber 11, so that the spread particles are capable of being extracted by the vacuum system 13 through the extracting pipe 131.

The Peltier elements 1212 can be flat plates, and each side of the polygonal shell 1211 has a substantially flat surface that incorporates a Peltier element 1212 configured to cool the ambient/proximity of the transferring chamber 11. The Peltier elements 1212 may cover the surface of the extracting pipe 131 with a large surface area. Since air space between the polygonal shell 1211 and the extracting pipe 131 influences efficiency of heat transfer, the air space between the polygonal shell 1211 and the extracting pipe 131 should be as small as possible, to improve the efficiency of heat transfer. The polygonal shell 1211 should have as many edges as possible. If the polygonal shell 1211 has too many edges, the numbers of the Peltier elements 1212 will be too much. Therefore, connection circuitry of Peltier elements 1212 would be complicated, and arrangements of the Peltier elements will be hard. According to assembly difficulty of production, the polygonal shell 1211 is a regular hexagonal shell.

Referring to FIG. 4A to FIG. 4D, in another embodiment, each Peltier element 1212 may include a group of small Peltier pieces 1214. The small Peltier pieces 1214 are arranged in arrays, and linked in serial or in parallel. The plurality of the small Peltier pieces 1214 are arranged in a network matching a shape of the outer circumferences of the polygonal shell. The circuits of the small Peltier pieces 1214 are electrically connected to a DC power source, so that the Peltier elements 1212 can cool the polygonal shell 1211. A size of a Peltier piece 1214 is 1 mm by 1 mm to 5 cm by 15 cm, and each circumference portion of the polygonal shell 1211 is 2 cm by 3 cm to 15 cm by 15 cm.

Figure 5:
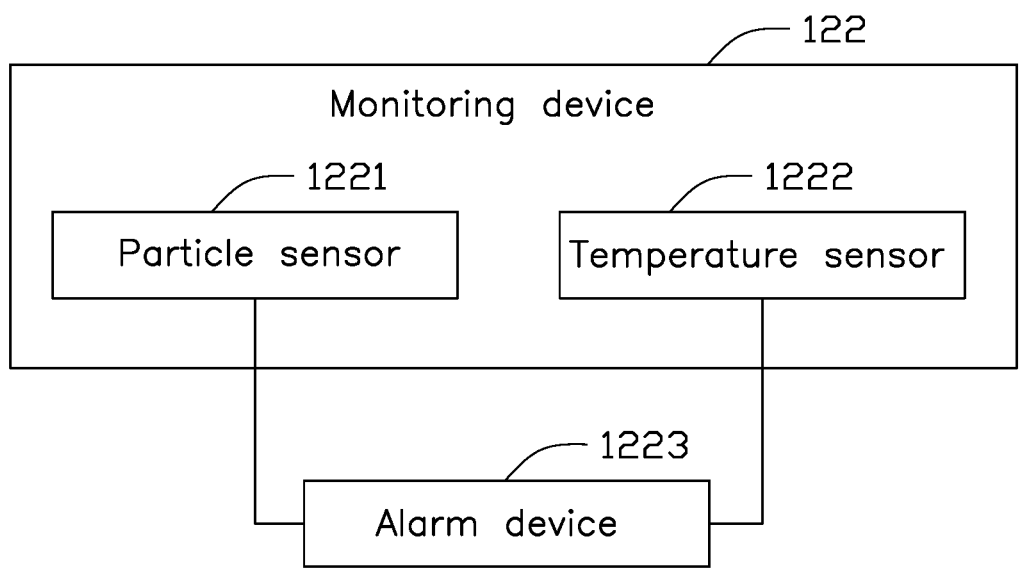
FIG. 5 is a block diagram of a monitoring device of the transferring device of FIG. 2.

Referring to FIG. 2, FIG. 3, and FIG. 5, the monitoring device 122 includes a particle sensor 1221 and a connecting tube 1215. The connecting tube 1215 connects the particle sensor 1221 and the extracting pipe 131. Samples of particles may enter the connecting tube 1215 to activate the particle sensor 1221, so that the particle sensor 1221 is capable of detecting particle concentration in the extracting pipe 131. A connection portion between the connecting tube 1215 and the extracting pipe 131 is sealed. Furthermore, a connecting hole 1213 for fixing the connecting tube 1215 is defined in the polygonal shell 1211. The connecting tube 1215 passes through the connecting hole 1213, and ends of the connecting tube 1215 connect the extracting pipe 131 and the particle sensor 1221. The particle sensor 1221 is a particle monitoring device counter. When a detected concentration of particles is greater than or equal to a preset value, the particle sensor 1221 sends information for cleaning the transferring chamber 11 or the extracting pipe 131.

The monitoring device 122 further includes a temperature sensor 1222 and an alarm device 1223. The temperature sensor 1222 detects temperature of the polygonal shell 1211 to determine the satisfactory working of Peltier elements 1212. The particle sensor 1221 and the temperature sensor 1222 are electrically connected to the alarm device 1223. The alarm device 1223 can be a display screen, a speaker, or a prompting light. When the particle concentration detected by the particle sensor 1221 is greater than or equal to a predetermined threshold value, the alarm device 1223 sends a warning to clean. When the temperature of the polygonal shell 1211 detected by the temperature sensor 1222 is greater than or equal to a preset value, a high temperature warning is sent by the alarm device 1223.

Second Embodiment

Figure 6:
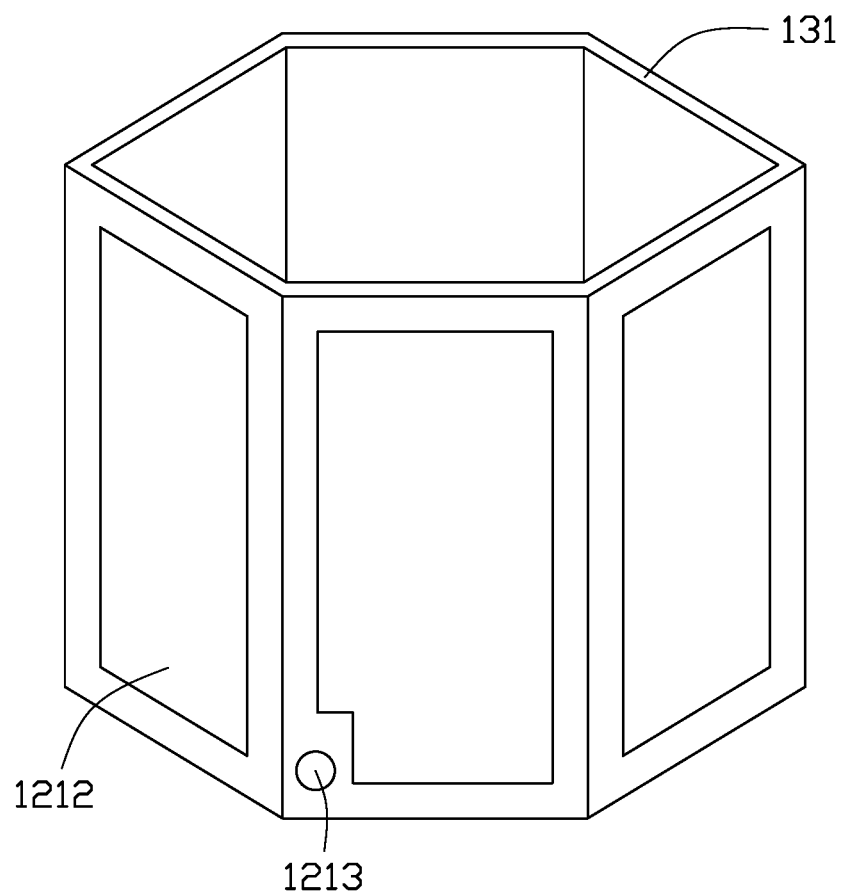
FIG. 6 illustrates a structure of a cooling apparatus of a transferring device in another embodiment.

Referring to FIG. 6, a transferring device of the second embodiment is similar to the transferring device of the first embodiment. The difference is that the extracting pipe 131 of the transferring device in the second embodiment is a polygonal pipe, and the Peltier elements 1212 are directly positioned on outer circumferences of the extracting pipe 131. The polygonal shell 1211 is not needed in the second embodiment. Therefore, no air space exists between the extracting pipe 131 and the Peltier elements 1212, and the efficiency of heat transfer is improved.

In another embodiment, some Peltier elements can be arranged at bottom of the transferring chamber 11, to enhance the cooling effect of the transferring chamber, so that kinetic energy of particles and fumes in the transferring chamber 11 can be reduced more quickly.

Figure 7:
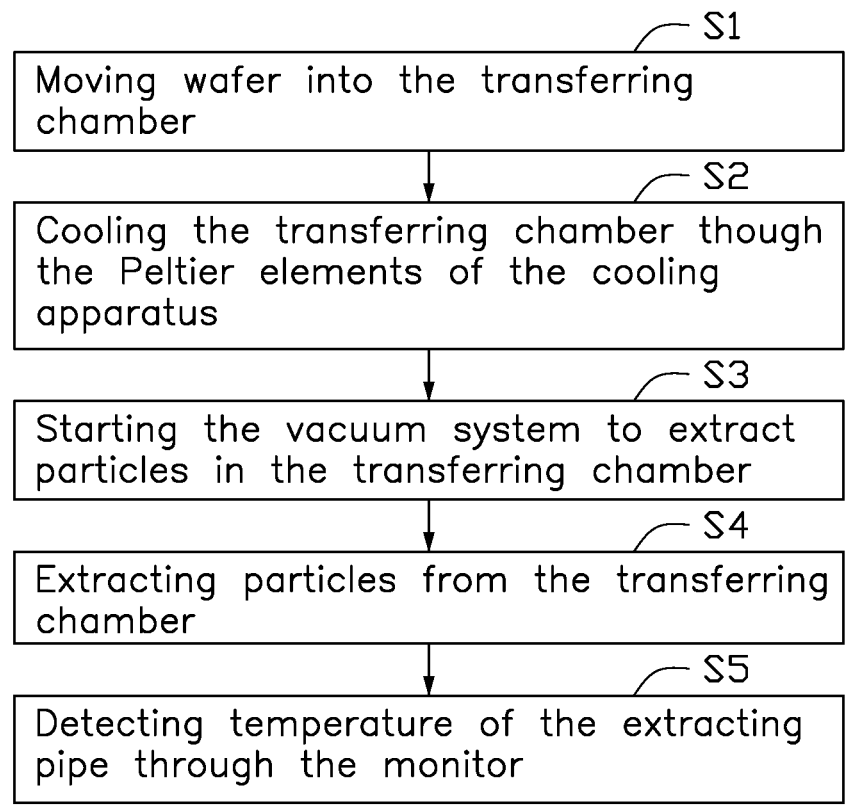
FIG. 7 is a flow chart of a method of cleaning a transferring chamber in a transferring device.

Referring to FIG. 7, a method of cleaning a transferring chamber in a transferring device is provided. The transferring device can be as described in the first embodiment or the second embodiment. The transferring device 10 includes the transferring chamber 11 configured to store the wafer 2 waiting for etching, the vacuum system 13 positioned below the transferring chamber 11 and configured to extract particles in the transferring chamber 11, and the thermoelectric device 12 connected with the vacuum system 13. The vacuum system 13 includes the extracting pipe 131 communicating with the transferring chamber 11. The thermoelectric device 12 comprises the cooling apparatus 121 positioned on the extracting pipe 131 and configured to cool the transferring chamber 11, and the monitoring device 122 configured to detect concentration of the particles of the transferring chamber 11. The cooling apparatus 121 includes the plurality of Peltier elements 1212 arranged on the extracting pipe 131 to cool the environment of the transferring chamber 11. The monitoring device 122 is positioned at the bottom of the cooling apparatus 121, and communicates with the extracting pipe 131.

The method includes following steps.

In step S1, the wafer 2 is moved into the transferring chamber 11 by the transferring mechanism 112.

In step S2, the Peltier elements 1212 cools the transferring chamber 11, so that particles in the transferring chamber 11 is cooled and attracted by the Peltier elements 1212 with low temperatures, so that the particles can fall to a lower part of the transferring chamber.

In step S3, particles and fume are extracted from the transferring chamber 11 by the vacuum system 13.

In step S4, particle concentration of the transferring chamber is detected through the monitoring device 122.

When the particle concentration detected by the monitoring device 122 is greater than or equal to a threshold value, an alarming signal is sent to an alarm device 1223 from the monitoring device 122. The alarm device 1223 sends a cleaning alert according to the alarming signal, so that the transferring chamber 11 and the extracting pipe 131 can be cleaned in need, and engineers don't need to check transferring device 10 in specific time anymore. The cleaning alert may include letters, voice, and light signals.

The method further includes a step S5, detecting temperature of the extracting pipe 131 through a temperature sensor 1222 of the monitoring device 122.

When the temperature of the extracting pipe 131 detected by the monitoring device 122 is greater than or equal to a preset value, a high temperature signal is sent to the alarm device 1223 from the temperature sensor 1222. The alarm device 1223 sends an alarming information according to the high temperature signal. Therefore, problems of Peltier elements or circuit can be checked or solved in time, the performance of the thermoelectric device 12 is improved. The alarming information may include letters, voice, and light signals.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A transferring device, comprising:
   a transferring chamber configured to store a wafer;
   a vacuum system positioned below the transferring chamber and configured to extract particles in the transferring chamber, the vacuum system comprises:
   an extracting pipe communicated with the transferring chamber; and
   a thermoelectric device positioned on the extracting pipe,
   wherein the thermoelectric device comprises a cooling apparatus and a monitoring device;
   the cooling apparatus positioned under the transferring chamber configured to cool the transferring chamber, such that particles in the transferring chamber are cooled and fall to a lower part of the transferring chamber, the cooling apparatus comprises a plurality of Peltier elements arranged on the extracting pipe to cool the transferring chamber;
   the monitoring device is positioned on the cooling apparatus and communicated with the extracting pipe, the monitoring device configured to detect a concentration of the particles in the extracting pipe and send a cleaning alert if the concentration of the particles is greater than or equal to a predetermined threshold value.

2. The transferring device of claim 1, wherein the cooling apparatus comprises a polygonal shell arranged around the extracting pipe, the plurality of Peltier elements are positioned on the polygonal shell.

3. The transferring device of claim 2, wherein the plurality of Peltier elements are arranged on outer circumferences of the polygonal shell, the plurality of Peltier elements are parallelly linked or serially linked together.

4. The transferring device of claim 3, wherein the plurality of Peltier elements are arranged in a network matching a shape of the outer circumferences of the polygonal shell.

5. The transferring device of claim 4, wherein a temperature of the polygonal shell is −10° C. to −20° C.

6. The transferring device of claim 2, wherein the monitoring device comprises a particle sensor configured to detect the particle concentration in the extracting pipe.

7. The transferring device of claim 6, wherein the particle sensor is connected to the extracting pipe through a connecting tube, and the particle sensor is activated by particles entering the connecting tube.

8. The transferring device of claim 7, wherein the polygonal shell defines a connecting hole, the connecting tube passes through the connecting hole.

9. The transferring device of claim 6, wherein the monitoring device further comprises a temperature sensor configured to detect the temperature in the polygonal shell.

10. The transferring device of claim 6, wherein the monitoring device comprises an alarm device, the particle sensor is electrically connected to the alarm device, the alarm device configured to send the cleaning alert when the particle concentration detected by the particle sensor is greater than or equal to the predetermined threshold value.

11. The transferring device of claim 1, wherein the extracting pipe is a polygonal pipe, and the plurality of Peltier elements are arranged on outer circumferences of the extracting pipe.

12. The transferring device of claim 11, wherein the monitoring device connects the extracting pipe via a connecting tube.

13. The transferring device of claim 1, wherein the transferring device further comprises a transferring mechanism configured to move the wafers, the transferring mechanism is positioned in the transferring chamber.

* * * * *